United States Patent
Ichikawa (10) Patent No.: US 7,249,297 B2
(45) Date of Patent: Jul. 24, 2007

(54) TEST METHOD FOR A SEMICONDUCTOR INTEGRATED CIRCUIT HAVING A MULTI-CYCLE PATH AND A SEMICONDUCTOR INTEGRATED CIRCUIT

(75) Inventor: Osamu Ichikawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 205 days.

(21) Appl. No.: 11/024,463

(22) Filed: Dec. 30, 2004

(65) Prior Publication Data

US 2005/0172189 A1  Aug. 4, 2005

(30) Foreign Application Priority Data

Jan. 16, 2004  (JP)  ............................. 2004-009725

(51) Int. Cl.
*G01R 31/28*  (2006.01)

(52) U.S. Cl. ................................... 714/724

(58) Field of Classification Search .................... None
See application file for complete search history.

(56) References Cited

U.S. PATENT DOCUMENTS

| | | | | |
|---|---|---|---|---|
| 6,145,105 A * | 11/2000 | Nadeau-Dostie et al. | ... | 714/726 |
| 6,327,684 B1 * | 12/2001 | Nadeau-Dostie et al. | ... | 714/731 |
| 6,442,722 B1 * | 8/2002 | Nadeau-Dostie et al. | ... | 714/731 |
| 2002/0147951 A1 * | 10/2002 | Nadeau-Dostie et al. | ... | 714/731 |

\* cited by examiner

*Primary Examiner*—Cynthia Britt
*Assistant Examiner*—Steven D. Radosevich
(74) *Attorney, Agent, or Firm*—McDermott Will & Emery LLP (57) ABSTRACT

The test method for a semiconductor integrated circuit includes a multi-cycle test step and a single-cycle test step. In the multi-cycle test step, a data-read side flipflop holds data according to a clock enable signal to test a multi-cycle path. In the single-cycle test step, no data is captured for the multi-cycle path.

16 Claims, 9 Drawing Sheets

| se | ce | Operation |
|----|----|-----------|
| 0  | x  | Capture   |
| 1  | 0  | Hold      |
| 1  | 1  | Shift     |

FIG. 7B

| se | ce | Operation |
|----|----|-----------|
| 0  | 1  | Capture   |
| 0  | 0  | Hold      |
| 1  | x  | Shift     |

FIG. 7C

| se | ce | Operation |
|----|----|-----------|
| 0  | 1  | Capture   |
| x  | 0  | Hold      |
| 1  | 1  | Shift     |

<Code definition of operation states of FFs (11, 22 and 31)>
S: Shift operation mode
H: Hold operation mode
C: Capture operation mode

TEST METHOD FOR A SEMICONDUCTOR INTEGRATED CIRCUIT HAVING A MULTI-CYCLE PATH AND A SEMICONDUCTOR INTEGRATED CIRCUIT

CROSS-REFERENCE TO RELATED APPLICATIONS

This application claims priority under 35 U.S.C. §119 on Patent Application No. 2004-9725 filed in Japan on Jan. 16, 2004, the entire contents of which are hereby incorporated by reference.

BACKGROUND OF THE INVENTION

The present invention relates to testing of a semiconductor integrated circuit with a built-in self-test, and more particularly, to testing of a circuit having a multi-cycle path.

In conventional testing of a semiconductor integrated circuit having a multi-cycle path, a scan flipflop (hereinafter, abbreviated as an "SFF") is allowed to hold the value thereof with a clock enable signal so that the held value is captured. U.S. Pat. No. 6,145,105 (FIGS. 3c, 4 and 5d) describes semiconductor integrated circuits having a multi-cycle path and test methods therefor.

Figure 7A:
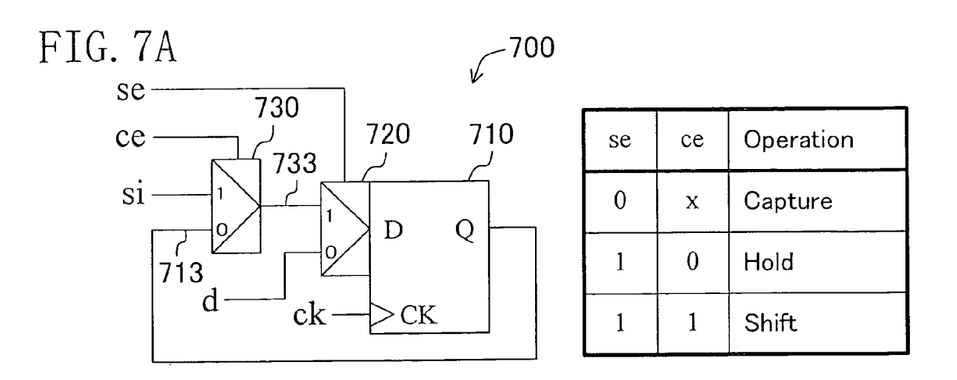
FIGS. 7A to 7E are views showing FF circuits having shift, capture and hold states.
Figure 7B:
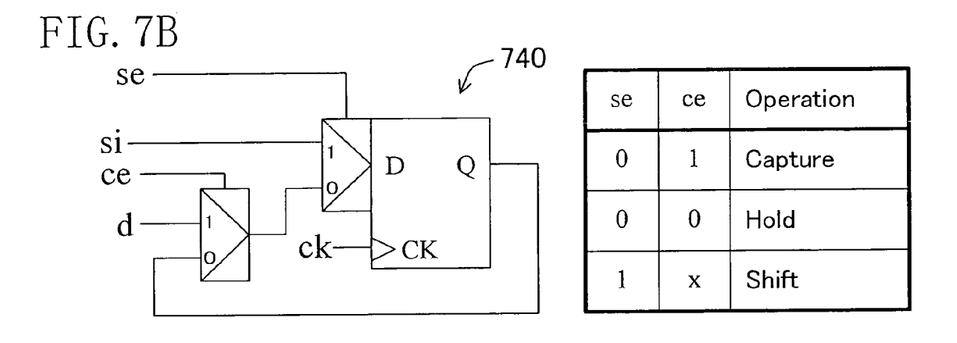
Figures 7C, 7D, 7E:
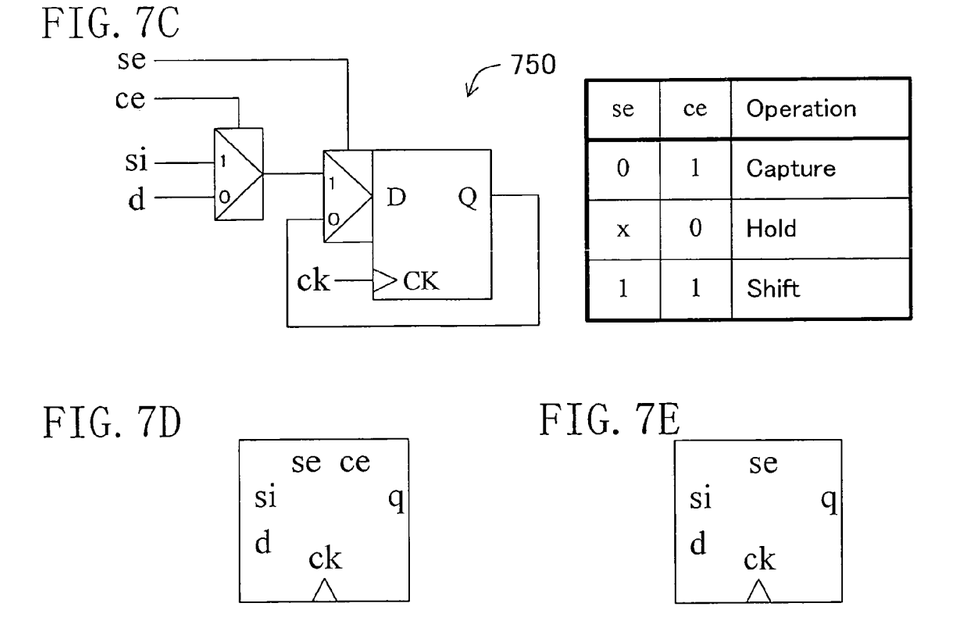
Figure 8:
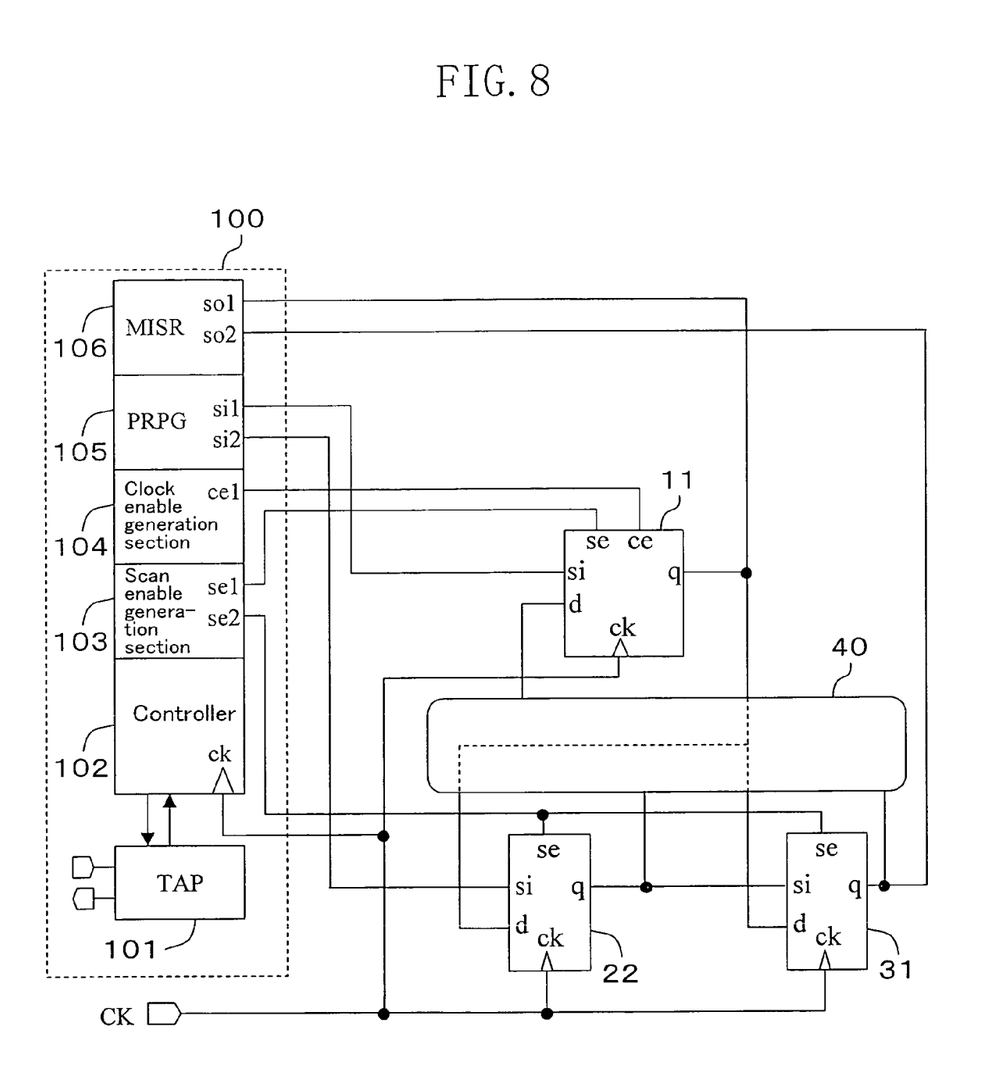
FIG. 8 is a block diagram of a conventional semiconductor integrated circuit.
Figure 9:
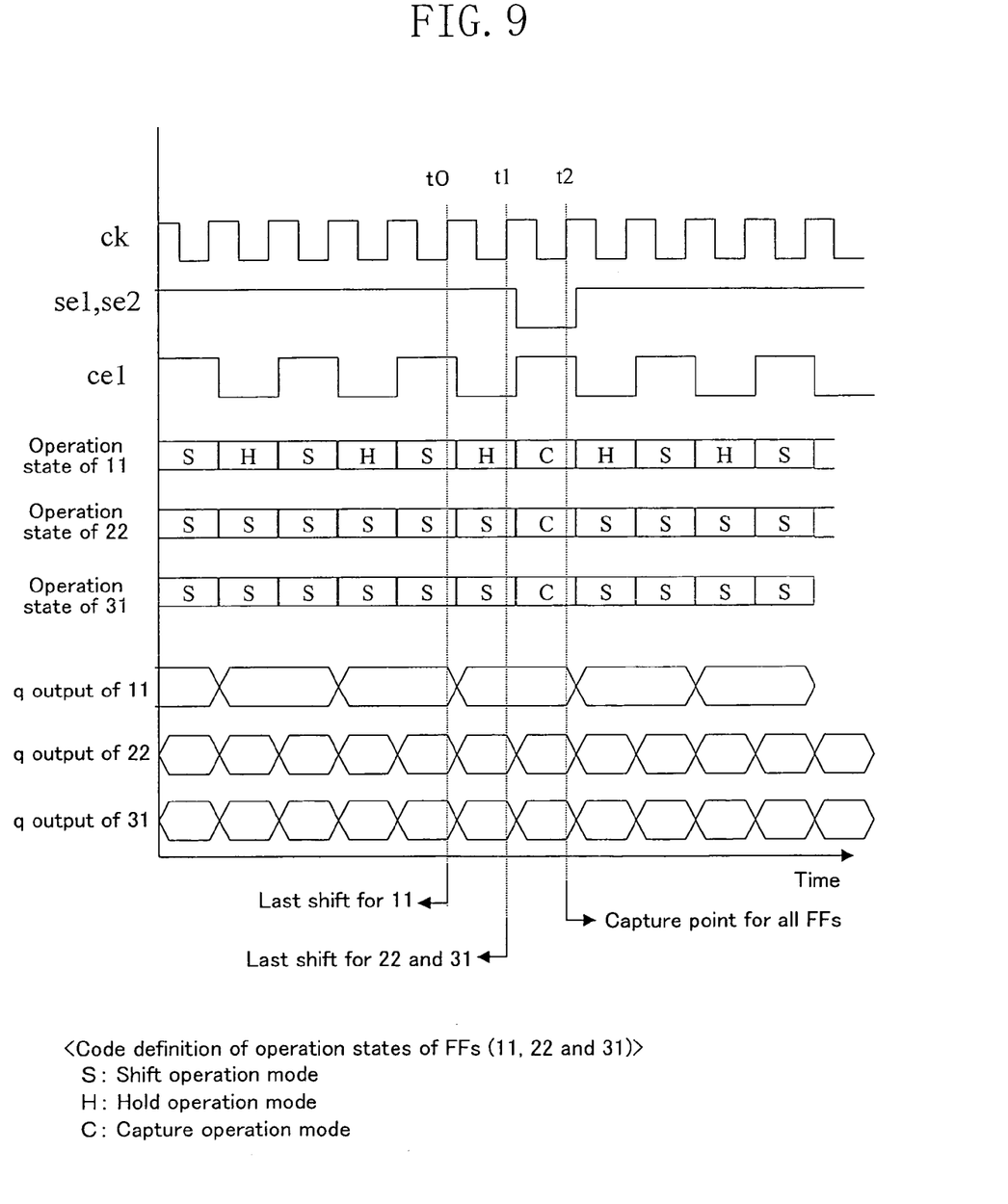
FIG. 9 is a waveform diagram of the semiconductor integrated circuit of FIG. 8.

FIG. 8 is a circuit diagram of a conventional semiconductor integrated circuit having a multi-cycle path, and FIG. 9 is a waveform diagram of this semiconductor integrated circuit. In this circuit, capture, hold and shift operations are implemented with SFFs as shown in FIGS. 7A to 7C. For example, an SFF 700 of FIG. 7A includes a selector 720 connected to a data input D of a data flipflop (hereinafter, abbreviated as a "DFF") 710 and a selector 730 connected to the selector 720. The DFF 710 has a clock input CK and a data output Q. The selector 720 selects either input data d or an output signal 733 of the selector 730 according to a scan enable signal se. The selector 730 selects either a scan input signal si or an output signal 713 of the DFF 710 according to a clock enable signal ce. Whether the DFF 710 operates shift or hold is determined with the value of the clock enable signal ce. By holding the value of the SFF with the clock enable signal ce, the operation of the SFF during the test can be made slower than the clock rate in the actual operation. The above operation implemented by the SFF 700 of FIG. 7A can also be implemented by SFFs 740 and 750 of FIGS. 7B and 7C. FIG. 7D illustrates any of the SFFs shown in FIGS. 7A to 7C, and FIG. 7E illustrates an SFF receiving no clock enable signal.

The operation of the conventional semiconductor integrated circuit having a multi-cycle path and a test method thereof will be described with reference to the circuit diagram of FIG. 8 and the waveform diagram of FIG. 9.

In FIG. 8, a first SFF 11 has a data output q, from which paths extend through a logic circuit 40 to a data input d of a second SFF 22 and also to a data input d of a third SFF 31. A BIST controller 100 includes a controller 102, a scan enable generation section 103, a clock enable generation section 104, a random pattern generator (PRPG) 105 and a data compressor (MISR) 106. The scan enable generation section 103 supplies a scan enable signal se1 to a terminal se of the SFF 11 and a scan enable signal se2 to terminals se of the SFFs 22 and 31. The clock enable generation section 104 supplies a clock enable signal ce1 to a terminal ce of the SFF 11. The random pattern generator 105 supplies a signal si1 to a scan input terminal si of the SFF 11 and a signal si2 to a scan input terminal si of the SFF 22. The data compressor 106 receives the outputs q of the SFFs 11 and 31 at inputs so1 and so2, respectively.

The SFF 11 operates shift and hold repeatedly according to the value of the clock enable signal ce1 as shown in the waveform in FIG. 9. In the illustrated example, the clock enable signal ce1 goes Low and High every cycle of the clock signal ck. Therefore, data is held for the duration of one clock cycle after each shift operation. The SFFs 22 and 31, receiving no clock enable signal, do not hold data. In the SFF 11, shift is done at time t0, hold comes at time t1, and then capture is done at time t2. Therefore, the shift at the time t0 is the last shift for the SFF 11 before the capture. In the SFFs 22 and 31, shift is done at time t0, shift, not hold, continues at time t1, and capture is done at time t2. Therefore, the shift at the time t1 is the last shift for the SFFs 22 and 31 before the capture. The value at the output q of the SFF 11 immediately before the capture is that held at the time t0, and the capture is done at the time t2, two clocks after the time t0, in the SFFs 22 and 31 that receive the data from the SFF 11 via the logic circuit 40. Thus, testing for the paths from the SFF 11 to the SFFs 22 and 31 receiving the data via the logic circuit 40 is performed at multi-cycle timing. In this way, the time length from the last shift to capture is extended to more than one clock cycle by providing hold for the SFF 11 during shift and immediately before capture using the clock enable signal ce and the scan enable signal se.

However, by holding the value of the SFF 11 with the clock enable signal ce as described above, data is captured at multi-cycle timing for all the paths from the output q of the SFF 11 to the data inputs d of the SFFs 22 and 31 for receiving data via the logic circuit 40. Therefore, even for a normally non-multi-cycle (single-cycle) path among the paths from the data output q of the SFF 11 to the SFFs 22 and 31 for receiving data via the logic circuit 40, data is captured at multi-cycle timing. For example, when the path from the data output q of the SFF 11 to the input d of the SFF 22 via the logic circuit 40 normally operates at multi-cycle timing while the path from the data output q of the SFF 11 to the input d of the SFF 31 via the logic circuit 40 normally operates at single-cycle timing, even the latter path to the SFF 31 that normally operates at single-cycle timing will be tested only at the multi-cycle timing. As a result, while the multi-cycled path can be tested in the actually used state, no actual operation speed check is available for the path normally operating at single-cycle timing.

SUMMARY OF THE INVENTION

An object of the present invention is providing a semiconductor integrated circuit in which, for a logic circuit including a multi-cycle path and a single-cycle path in the normal operation, actual operation check at multi-cycle timing can be made for the multi-cycle path while actual operation check at single-cycle timing can be made for the single-cycle path, and a test method for such a semiconductor integrated circuit.

The test method for a semiconductor integrated circuit of the present invention is a test method for a semiconductor integrated circuit having a multi-cycle path. The semiconductor integrated circuit includes: a scannable first memory element operating with edges of a clock signal and having a data input and a data output; at least one scannable second memory element for receiving, at a data input, data having propagated from the data output of the first memory element through a path in a logic circuit operable in multiple cycles longer than one cycle of a system clock rate, operating with edges of the clock signal, and outputting data from a data output; and at least one scannable third memory element for receiving, at a data input, data having propagated from the data output of the first memory element through a single-cycle path in the logic circuit operable in one cycle of the system clock rate, operating with edges of the clock signal, and outputting data from a data output. The test method includes a multi-cycle test step and a single-cycle test step. The multi-cycle test step includes: a scan step of connecting the data input of each of the first, second and third memory elements with the data output of another of the scannable memory elements to define a scan chain and shifting a test pattern serially into all the scannable memory elements in the scan chain at a test clock rate; a multi-cycle hold step of holding data in the first memory element prior to capture operation or during the scan step for the duration of the number of cycles equal to or greater than the number of multiple cycles required from the data output of the first memory element to the data input of the second memory element; a multi-cycle capture step of connecting the data inputs of the first, second and third memory elements with the logic circuit and capturing a response of the logic circuit to the test pattern via the data inputs of the memory elements; and a shift-out step of connecting the data input of each of the first, second and third memory elements with the data output of another of the scannable memory elements to define a scan chain and shifting out data from the memory element. The single-cycle test step includes: the scan step; a single-cycle capture step of connecting the data inputs of the first, second and third memory elements with the logic circuit, and holding data for the second memory element while capturing a response of the logic circuit to the test pattern via the data inputs for the memory elements other than the second memory element; and the shift-out step.

Alternatively, the test method for a semiconductor integrated circuit of the present invention is a test method for a semiconductor integrated circuit having a multi-cycle path. The semiconductor integrated circuit includes: a scannable first memory element operating with edges of a clock signal and having a data input and a data output; at least one scannable second memory element for receiving, at a data input, data having propagated from the data output of the first memory element through a path in a logic circuit operable in multiple cycles longer than one cycle of a system clock rate, operating with edges of the same clock signal as that used for the first memory element, and outputting data from a data output; and at least one scannable third memory element for receiving, at a data input, data having propagated from the data output of the first memory element through a single-cycle path in the logic circuit operable in one cycle of the system clock rate, operating with edges of the same clock signal as that used for the first memory element, and outputting data from a data output. The test method includes a multi-cycle test step and a single-cycle test step. The multi-cycle test step includes: a scan step of connecting the data input of each of the first, second and third memory elements with the data output of another of the scannable memory elements to define a scan chain and shifting a test pattern serially into all the scannable memory elements in the scan chain at a test clock rate; a multi-cycle hold step of holding data in the first memory element prior to capture operation or during the scan step for the duration of the number of cycles equal to or greater than the number of multiple cycles required from the data output of the first memory element to the data input of the second memory element; a multi-cycle capture step of connecting the data inputs of the first, second and third memory elements with the logic circuit and capturing a response of the logic circuit to the test pattern via the data inputs of the memory elements; and a shift-out step of connecting the data input of each of the first, second and third memory elements with the data output of another of the scannable memory elements to define a scan chain and shifting out data from the memory element. The single-cycle test step includes: the scan step; a single-cycle capture step of connecting the data input of the second memory element with the data output of another of the memory elements while connecting the data inputs of the memory elements other than the second memory element with the logic circuit, and capturing data output from the memory element immediately preceding the second memory element in the same scan chain for the second memory element while capturing a response of the logic circuit to the test pattern via the data inputs for the memory elements other than the second memory element; and the shift-out step.

Alternatively, the test method for a semiconductor integrated circuit of the present invention is a test method for a semiconductor integrated circuit having a multi-cycle path. The semiconductor integrated circuit includes: a scannable first memory element operating with edges of a clock signal and having a data input and a data output; at least one scannable second memory element for receiving, at a data input, data having propagated from the data output of the first memory element through a path in a logic circuit operable in multiple cycles longer than one cycle of a system clock rate, operating with edges of the same clock signal as that used for the first memory element, and outputting data from a data output; and at least one scannable third memory element for receiving, at a data input, data having propagated from the data output of the first memory element through a single-cycle path in the logic circuit operable in one cycle of the system clock rate, operating with edges of the same clock signal as that used for the first memory element, and outputting data from a data output. The test method includes a multi-cycle test step and a single-cycle test step. The multi-cycle test step includes: a scan step of connecting the data input of each of the first, second and third memory elements with the data output of another of the scannable memory elements to define a scan chain and shifting a test pattern serially into all the scannable memory elements in the scan chain at a test clock rate; a multi-cycle hold step of holding data in the first memory element prior to capture operation or during the scan step for the duration of the number of cycles equal to or greater than the number of multiple cycles required from the data output of the first memory element to the data input of the second memory element; a multi-cycle capture step of connecting the data inputs of the first, second and third memory elements with the logic circuit and capturing a response of the logic circuit to the test pattern via the data inputs of the memory elements; and a shift-out step of connecting the data input of each of the first, second and third memory elements with the data output of another of the scannable memory elements to define a scan chain and shifting out data from the memory element. The single-cycle test step includes: the scan step; a single-cycle capture step of connecting the data input of the second memory element with the data output of another of the memory elements while connecting the data inputs of the memory elements other than the second memory element with the logic circuit, and capturing data output from the memory element immediately preceding the second memory element in the same scan chain for the second memory element while capturing a response of the logic circuit to the test pattern via the data inputs for the memory elements other than the second memory element; and the shift-out step.

In the test method described above, a scan chain for the first memory element is preferably defined separately from the other scan chain.

In the test method described above, preferably, the test pattern is shifted in during the shift-out step.

Preferably, the test method described above is repeated a necessary number of times.

The semiconductor integrated circuit of the present invention is a semiconductor integrated circuit having a multi-cycle path, including: a scannable first memory element operating with edges of a clock signal and having a data input and a data output; at least one scannable second memory element for receiving, at a data input, data having propagated from the data output of the first memory element through a path in a logic circuit operable in multiple cycles longer than one cycle of a system clock rate, operating with edges of the same clock signal as that used for the first memory element, and outputting data from a data output; and at least one scannable third memory element for receiving, at a data input, data having propagated from the data output of the first memory element through a single-cycle path in the logic circuit operable in one cycle of the system clock rate, operating with edges of the same clock signal as that used for the first memory element, and outputting data from a data output. The semiconductor integrated circuit has a multi-cycle test mode and a single-cycle test mode. In the multi-cycle test mode, a scan mode, a multi-cycle hold mode, a multi-cycle capture mode and a shift-out mode are selectively executed. In the single-cycle test mode, the scan mode, a single-cycle capture mode and the shift-out mode are selectively executed. In the scan mode, the data input of each of the first, second and third memory elements is connected with the data output of another of the memory elements to define a scan chain, and a test pattern is shifted serially into all the memory elements in the scan chain at a test clock rate. In the multi-cycle hold mode, data is held in the first memory element prior to capture operation or during the scan step for the duration of the number of cycles equal to or greater than the number of multiple cycles required from the data output of the first memory element to the data input of the second memory element. In the multi-cycle capture mode, the data inputs of the first, second and third memory elements are connected with the logic circuit, and a response of the test pattern from the logic circuit is captured via the data inputs of the memory elements. In the shift-out mode, the data input of each of the first, second and third memory elements is connected with the data output of another of the scannable memory elements to define a scan chain, and data from the memory element is shifted out, to analyze the output response captured into the memory element. In the single-cycle capture mode, the data inputs of the first, second and third memory elements are connected with the logic circuit, and data is held for the second memory element, while a response of the test pattern from the logic circuit is captured via the data inputs for the memory elements other than the second memory element.

Preferably, the semiconductor integrated circuit described above further includes: a clock enable signal generation section for generating a clock enable signal for holding the value of any of the scannable memory elements to configure the scannable memory element in one specific mode among the modes; a scan enable signal generation section for generating a scan enable signal for putting the scannable memory elements in the scan mode; and a multi-cycle test enable signal generation section for generating a multi-cycle test enable signal for selecting either the multi-cycle test mode or the single-cycle test mode.

In the semiconductor integrated circuit described above, a pseudo-random pattern generator (PRPG) is preferably used for generation of the test pattern.

In the semiconductor integrated circuit described above, a compressor (MISR) is preferably used for analysis of the output response.

In the semiconductor integrated circuit described above, a signal generated by the pseudo-random pattern generator is preferably used as the multi-cycle test enable signal for selecting either the multi-cycle test mode or the single-cycle test mode.

According to the present invention, a multi-cycle test step and a single-cycle test step are provided in testing of a semiconductor integrated circuit having a multi-cycle path. In the multi-cycle test step, a test is performed for a multi-cycle path and a single-cycle path in multiple cycles. In the single-cycle test step, a test is performed in a single cycle for the single-cycle path, while for the multi-cycle path, no data is captured during the capture step. In this way, the semiconductor integrated circuit having a multi-cycle path can be tested in the actual operation state.

DESCRIPTION OF THE PREFERRED EMBODIMENTS

Hereinafter, a preferred embodiment of the present invention will be described with reference to the accompanying drawings. In the drawings, the same or like components are denoted by the same reference numerals, and the description thereof is not repeated.

Figure 1:
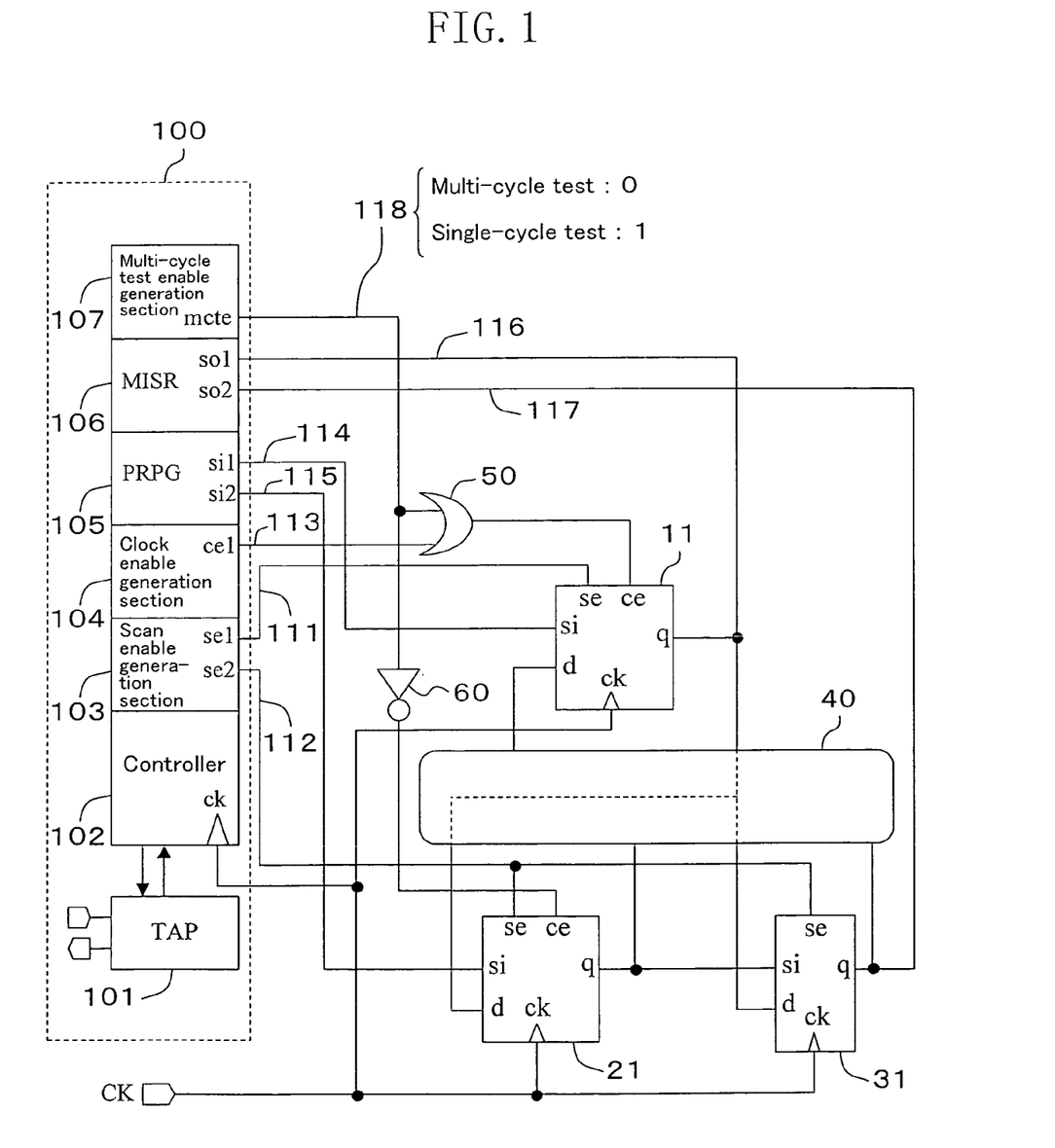
FIG. 1 is a block diagram of a semiconductor integrated circuit of an embodiment of the present invention.

FIG. 1 is a block diagram schematically showing a semiconductor integrated circuit of an embodiment of the present invention. The semiconductor integrated circuit of this embodiment includes a scannable first memory element 11, a scannable second memory element 21 and a scannable third memory element 31, which are described in this embodiment as being the circuit 700 shown in FIG. 7A, the circuit 740 shown in FIG. 7B and the circuit shown in FIG. 7E, respectively.

The reference numeral 40 denotes a logic circuit. A path extending from a data output q of the first memory element 11 to a data input d of the second memory element 21 through the logic circuit 40 is a multi-cycle path requiring two cycles of the system clock to transfer data therethrough. A path extending from the data output q of the first memory element 11 to a data input d of the third memory element 31 is a single-cycle path requiring one cycle of the system clock to transfer data therethrough.

A BIST controller 100 includes a test access port (TAP) 101, a controller 102, a scan enable generation section 103, a clock enable generation section 104, a random pattern generator (PRPG) 105, a compressor (MISR) 106 and a multi-cycle test enable generation section 107.

The scan enable generation section 103 generates a scan enable signal se1 (111) for the first memory element 11 and a scan enable signal se2 (112) for the second and third memory elements 21 and 31. Depending on the values of the scan enable signals se1 and se2 supplied, the memory elements 11, 21 and 31 selectively capture the scan input si or the data input d.

The clock enable generation section 104 generates a clock enable signal ce1 (113) for the first memory element 11. The first memory element 11 switches between the hold state (capturing the value from the data output) and the shift state (capturing a scan input signal si1 supplied to the scan input si) according to the value of the clock enable signal ce1 (113) when the scan enable signal se1 (111) is active. In this embodiment, in which the path from the first memory element 11 to the second memory element 21 is a 2-cycle path, the clock enable signal ce1 (113) is generated so as to be active every other rising edge of the clock signal ck having the same period as the system clock.

The random pattern generator 105 supplies the signal si1 (114) to the scan input of a first scan chain composed of the first memory element 11, and supplies a signal si2 (115) to the scan input of a second scan chain composed of the second and third memory elements 21 and 31.

The compressor 106 captures scan-out outputs 116 and 117 of the first and second scan chains at its input terminals so1 and so2, respectively.

The multi-cycle test enable generation section 107 generates a signal for distinguishing a multi-cycle test mode from a single-cycle test mode. In this embodiment, generated is a mcte signal 118 that is "0" for the multi-cycle test and "1" for the single-cycle test.

An OR circuit 50 receives the mcte signal 118 and the ce1 signal 113 as its inputs and outputs the OR result to the ce terminal of the first memory element 11.

An inverter 60 outputs the inverted value of the mcte signal 118 to the ce terminal of the second memory element 21.

Figure 2:
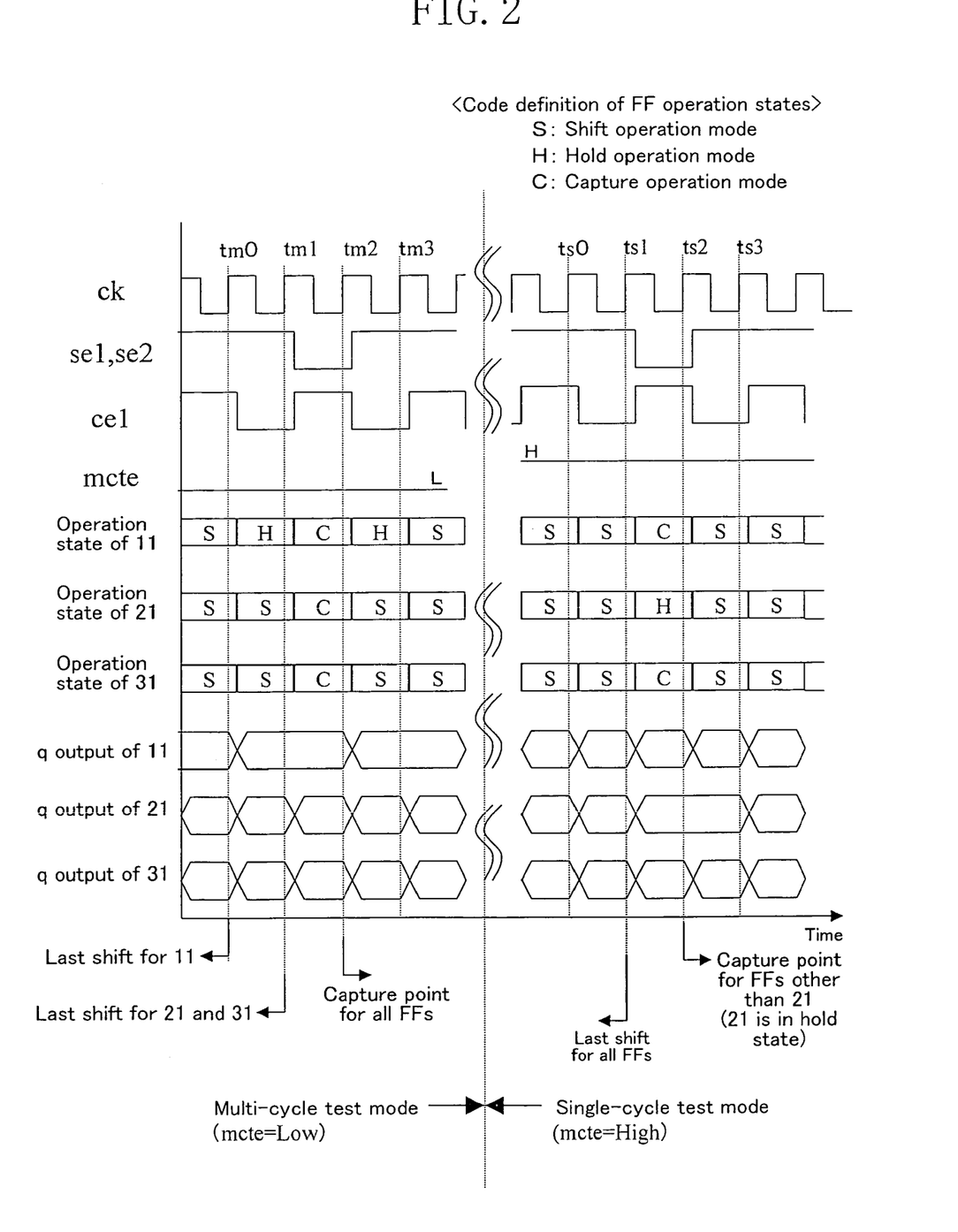
FIG. 2 is a waveform diagram of the semiconductor integrated circuit of FIG. 1.

FIG. 2 is a waveform diagram adopted in testing of the semiconductor integrated circuit of FIG. 1. Hereinafter, a test method for the semiconductor integrated circuit having a multi-cycle path will be described with reference to FIGS. 1 and 2.

In FIG. 2, "S", "H" and "C" in the operation states of the memory elements 11, 21 and 31 represent a shift step, a hold step and a capture step, respectively. The test method includes a multi-cycle test step corresponding to the duration over which the mcte signal is Low and a single-cycle test step corresponding to the duration over which the mcte signal is High.

Multi-Cycle Test Step

At time tm0 in the multi-cycle test step, at which the signals se1 and se2 are High and the signal ce1 is High, all of the first and second and third memory elements 11, 21 and 31 are in the shift step. Therefore, the value at the scan input of each element is shifted as scan input data.

At time tm1 in the multi-cycle test step, at which the signals se1 and se2 are High and the signal ce1 is Low, the first memory element 11 is put in the hold step while the second and third memory elements 21 and 31 stay in the shift step. Therefore, the value shifted at the time tm0 is held in the first memory element 11, while the values at the scan inputs of the memory elements 21 and 31 are shifted as the scan input data.

At time tm2 in the multi-cycle test step, at which the signals se1 and se2 are Low and the signal ce1 is High, all of the first, second and third memory elements 11, 21 and 31 are put in the capture step. Therefore, the value at the data input of each element is captured.

The second scannable memory element 21 captures the value from the first memory element 11, which has been determined at the time tm0, at the time tm2 two clocks behind the time tm0. In this way, data can be captured at the same timing as the actual 2-cycle operation.

The third memory element 31 also captures the value from the first memory element 11, which has been determined at the time tm0, at the time tm2 two clocks behind the time tm0. Therefore, data is captured at timing different from the actual single-cycle operation.

At time tm3 in the multi-cycle test step, at which the signals se1 and se2 are High and the signal ce1 is Low, the first memory element 11 is put in the hold step while the second and third memory elements 21 and 31 are put in the shift step. Therefore, the value captured at the time tm2 is held in the first memory element 11, while the values captured at the time tm2 are shifted out in the memory elements 21 and 31.

Single-Cycle Test Step

At time ts0 in the single-cycle test step, at which the signals se1 and se2 are High and the signal ce1 is High, all of the first and second and third memory elements 11, 21 and 31 are in the shift step. Therefore, the value at the scan input of each element is shifted as the scan input data.

At time ts1 in the single-cycle test step, the signals se1 and se2 are High and the signal ce1 is Low. However, since the signal mcte is High, the signal input into the ce terminal of the first memory element 11 is High. Thus, the first memory element 11 stays in the shift step, and the second and third memory elements 21 and 31 also stay in the shift step. The value at the scan input of each element is shifted as the scan input data.

At time ts2 in the single-cycle test step, the signals se1 and se2 are Low and the signal ce1 is High. However, since the signal mcte is High, the signal input into the ce terminal of the second memory element 21 is Low. Therefore, while the first and third memory elements 11 and 31 are put in the capture step, the second memory element 21 is put in the hold step. Thus, while each of the first and third memory elements 11 and 31 captures the value at its data input, the second memory element 21 holds the data.

If the second memory element 21 captures the value from the first memory element 11, which has been determined at the time ts1, at the time ts2 one clock behind the time ts1, correct data capture fails because the second memory element 21 actually performs 2-cycle operation. Therefore, by holding data at this time, the second memory element 21 is prevented from capturing the value from the first memory element 11.

The third memory element 31 captures the value from the first memory element 11, which has been determined at the time ts1, at the time ts2 one clock behind the time ts1. Therefore, data can be captured at the same timing as the actual single-cycle operation.

At time ts3 in the single-cycle test step, the signals se1 and se2 are High and the signal ce1 is Low. Therefore, all of the first, second and third memory elements 11, 21 and 31 are put in the shift step, and the values captured at the time ts2 are shifted out.

As described above, in the embodiment of the present invention, testing of a semiconductor integrated circuit having a multi-cycle path includes the multi-cycle test step and the single-cycle test step. In the multi-cycle test step, data is held in the hold step to perform testing in multiple cycles. In the single-cycle test step, no hold step is given, to test a single-cycle path in its actual operation state. For the multi-cycle path, a flipflop for receiving data during the capture operation is put in the hold state. In this way, both the single-cycle path and the multi-cycle path can be tested in their individual actual operation states.

In this embodiment, the multi-cycle test step and the single-cycle test step corresponded to the durations over which the mcte signal is Low and High, respectively. Alternatively, by changing the OR circuit 50 and the inverter circuit 60, the multi-cycle test step and the single-cycle step may be made to correspond to the durations over which the mcte signal is High and Low, respectively. In this case, also, the same effect as that described in this embodiment can be obtained.

Figure 3:
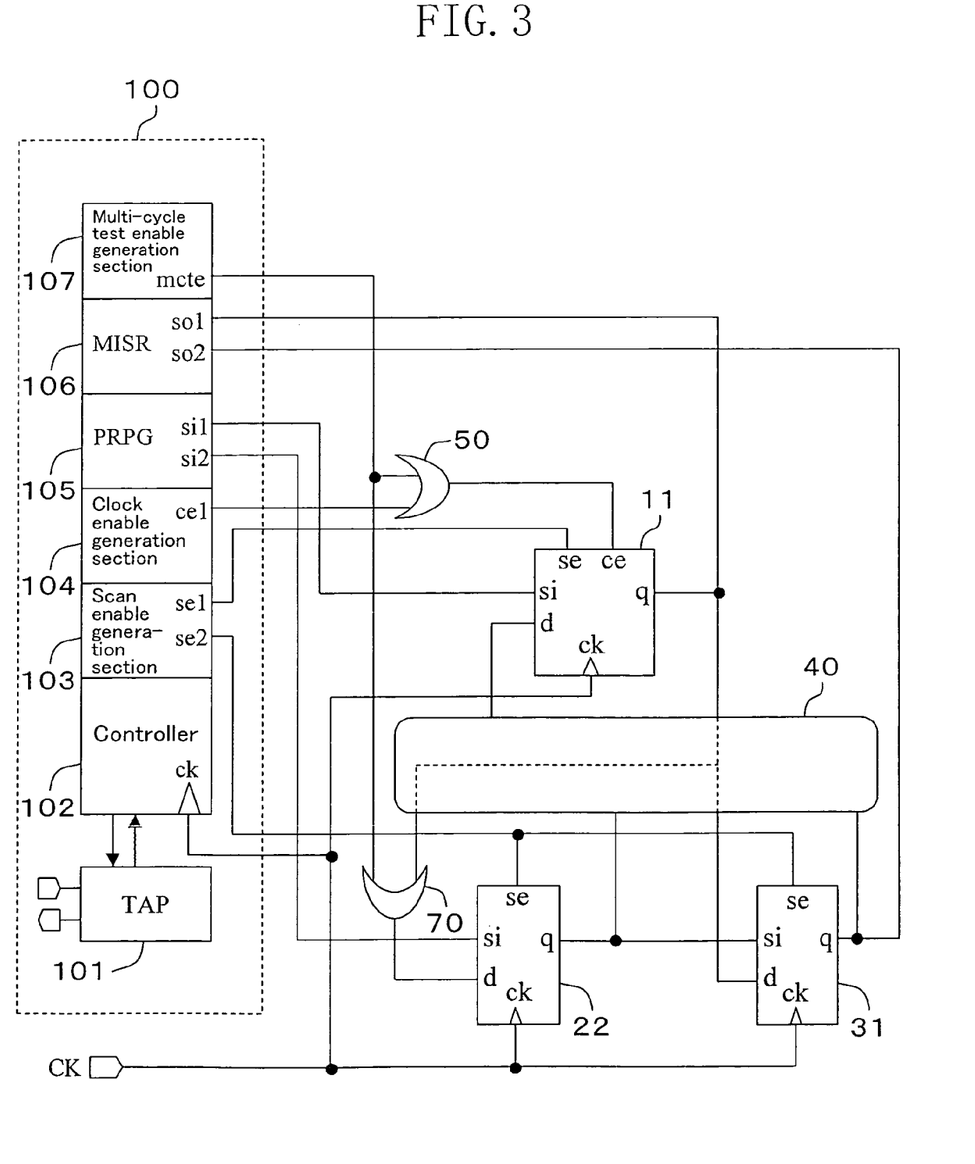
FIG. 3 is a block diagram of an alteration to the semiconductor integrated circuit of FIG. 1.
Figure 4:
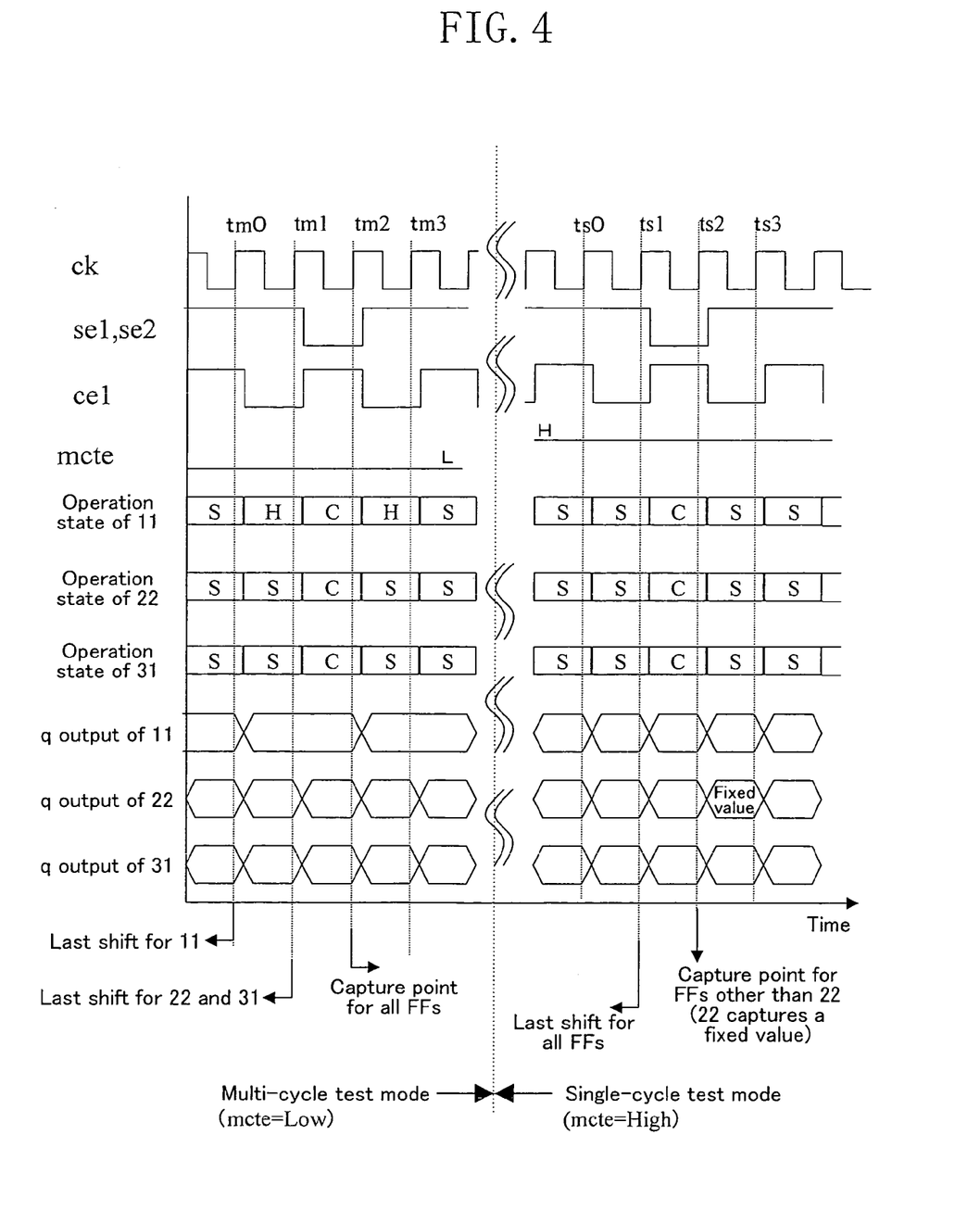
FIG. 4 is a waveform diagram of the semiconductor integrated circuit of FIG. 3.

In this embodiment, the circuit of FIG. 7B was used as the second memory element 21. Alternatively, the SFF of FIG. 7E may be used as a second memory element 22 in place of the second memory element 21. FIG. 3 shows a configuration of a semiconductor integrated circuit of this alteration. In this circuit, an OR circuit 70 is provided in place of the inverter circuit 60 in FIG. 1. The OR circuit 70 outputs the result of OR between the output of the logic circuit 40 and the signal mcte to the input d of the second memory element (SFF) 22. As shown in FIG. 4, in the semiconductor integrated circuit of FIG. 3, the SFF 22 captures the output value of the OR circuit 70, of which the inputs are the output of the logic circuit 40 and the signal mcte, via the d input thereof in the capture step of the single-cycle test step. Therefore, the SFF 22 captures a fixed value. In this way, the same effect as that described above in this embodiment can also obtained.

Figure 5:
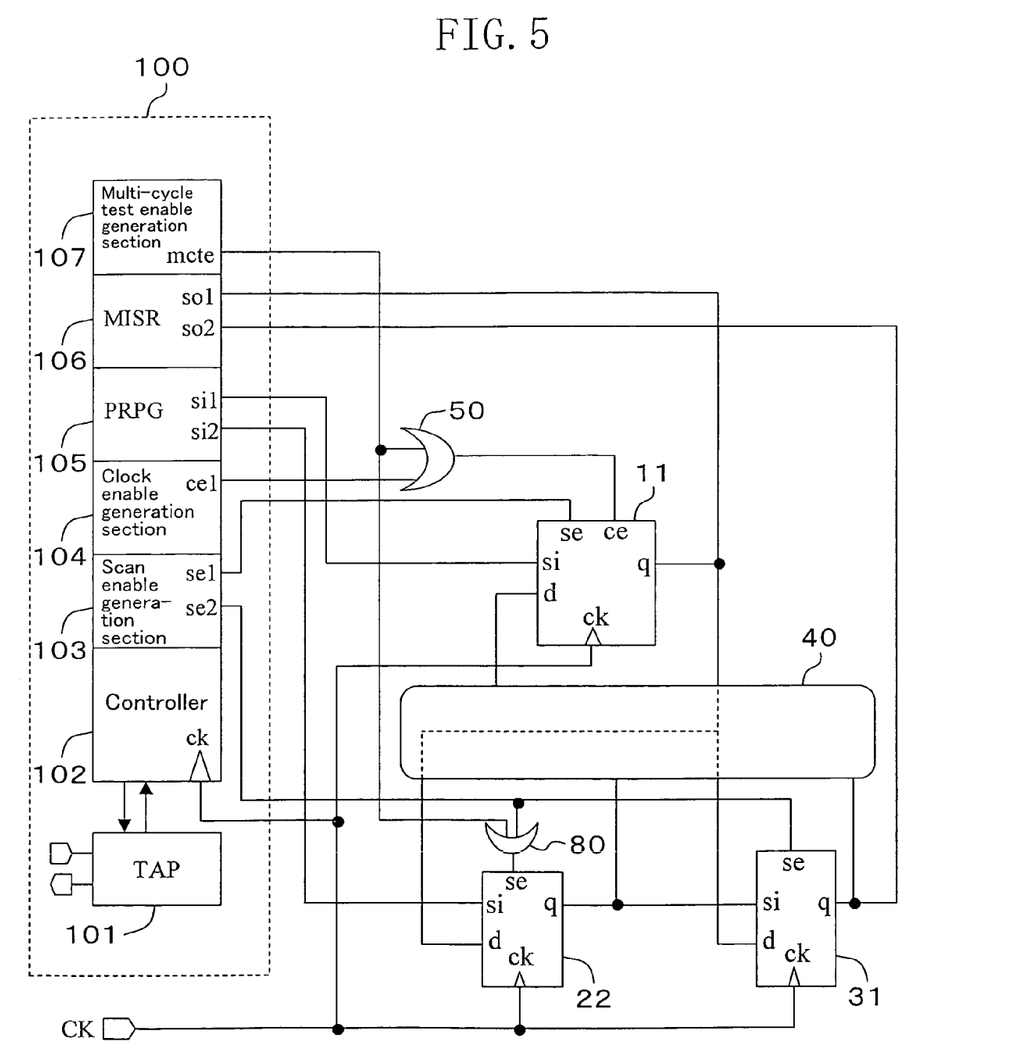
FIG. 5 is a block diagram of another alteration to the semiconductor integrated circuit of FIG. 1.
Figure 6:
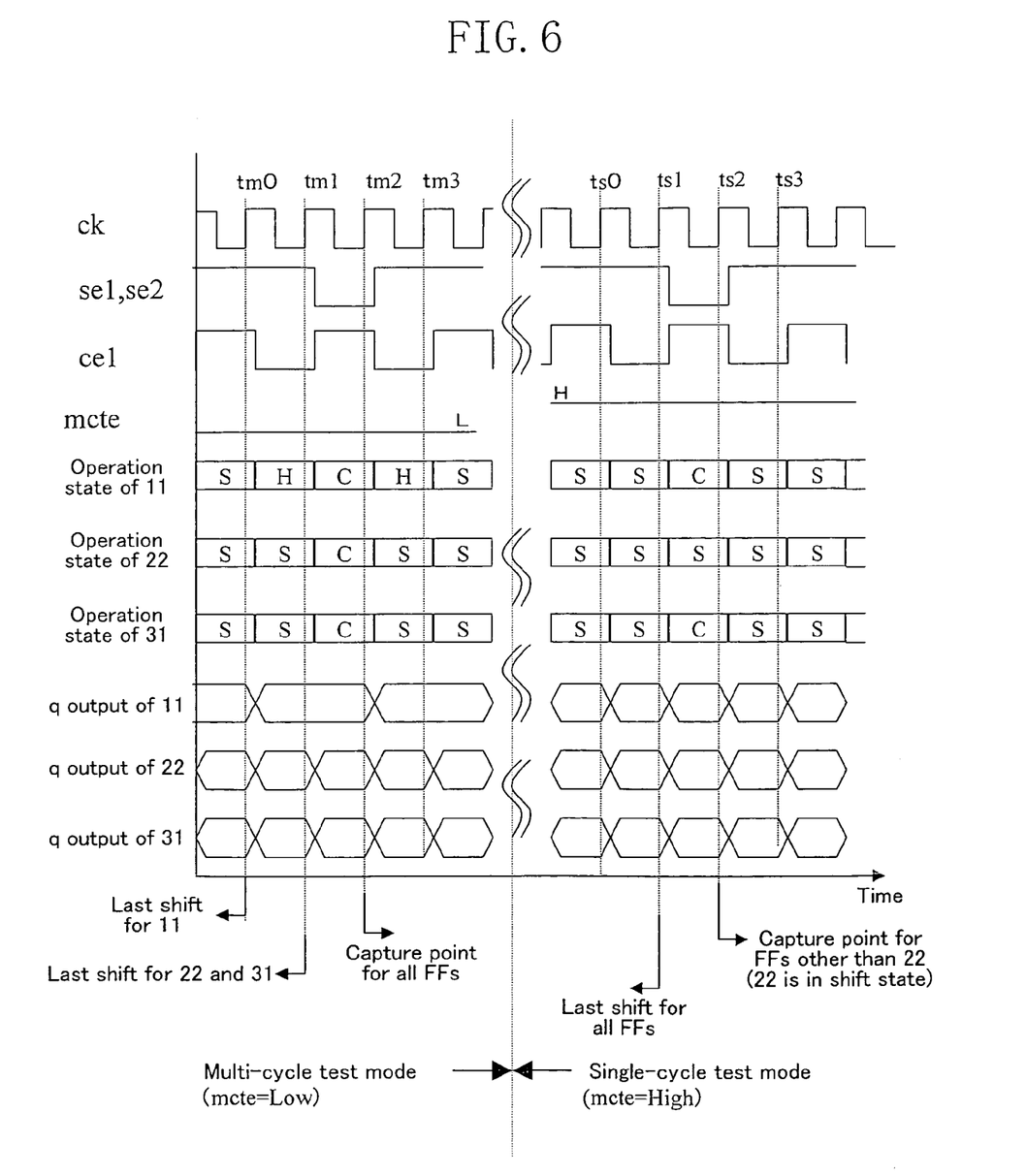
FIG. 6 is a waveform diagram of the semiconductor integrated circuit of FIG. 5.

FIG. 5 shows another configuration of the semiconductor integrated circuit using the second memory element 22 composed of the SFF of FIG. 7E in place of the second memory element 21 composed of the circuit of FIG. 7B. In the circuit of FIG. 5, an OR circuit 80 is provided in place of the inverter circuit 60 in FIG. 1. The OR circuit 80 outputs the result of OR between the scan enable signal se2 and the signal mcte to the input se of the second memory element (SFF) 22. In the semiconductor integrated circuit of FIG. 5, the output value of the OR circuit 80, of which the inputs are the scan enable signal se2 and the signal mcte, is used as the scan enable signal se for the SFF 22. Therefore, as shown in FIG. 6, at time ts2 in the capture step of the single-cycle test step, the second memory element (SFF) 22 operates shift, not capture. Thus, the SFF 22 won't receive the output of the first memory element 11 after one cycle in the capture step of the single-cycle test step. In this way, the same effect as that described above in this embodiment can also obtained.

In this embodiment, the multi-cycle test step and the single-cycle test step were given using the value output from the multi-cycle test enable generation section. The effect described in this embodiment can also be obtained by using the value from the random pattern generator (PRPG).

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A test method for a semiconductor integrated circuit having a multi-cycle path, the semiconductor integrated circuit comprising:

a scannable first memory element operating with edges of a clock signal and having a data input and a data output;

at least one scannable second memory element for receiving, at a data input, data having propagated from the data output of the first memory element through a path in a logic circuit operable in multiple cycles longer than one cycle of a system clock rate, operating with edges of the clock signal, and outputting data from a data output;

at least one scannable third memory element for receiving, at a data input, data having propagated from the data output of the first memory element through a single-cycle path in the logic circuit operable in one cycle of the system clock rate, operating with edges of the clock signal, and outputting data from a data output;

a multi-cycle test enable generation section for generating a signal for distinguishing a multi-cycle test mode from a single-cycle test mode;

the test method comprising a multi-cycle test step and a single-cycle test step, and the multi-cycle test step comprising:

a scan step of connecting the data input of each of the first, second and third memory elements with the data output of another of the scannable memory elements to define a plurality of scan chains and shifting a test pattern serially into all the scannable memory elements in the scan chain at a test clock rate;

a multi-cycle hold step of holding data in the first memory element prior to a capture operation or during the scan step for the duration of the number of cycles equal to or greater than the number of multiple cycles required from the data output of the first memory element to the data input of the second memory element;

a multi-cycle capture step of connecting the data inputs of the first, second and third memory elements with the logic circuit and capturing a response of the logic circuit to the test pattern via the data inputs of the memory elements; and a shift-out step of connecting the data input of each of the first, second and third memory elements with the data output of another of the scannable memory elements to define the plurality of a scan chains and shifting out data from the memory element, and the single-cycle test step comprising:

the scan step;

a single-cycle capture step of connecting the data inputs of the first, second and third memory elements with the logic circuit, and holding data for the second memory element while capturing a response of the logic circuit to the test pattern via the data inputs for the memory elements other than the second memory element; and the shift-out step.

2. The test method for a semiconductor integrated circuit of claim 1, wherein a scan chain for the first memory element is defined separately from the other scan chains.

3. The test method for a semiconductor integrated circuit of claim 1, wherein the test pattern is shifted in during the shift-out step.

4. A test method for a semiconductor integrated circuit, comprising repeating the test method of claim 1 a necessary number of times.

5. A test method for a semiconductor integrated circuit having a multi-cycle path, the semiconductor integrated circuit comprising:
   a scannable first memory element operating with edges of a clock signal and having a data input and a data output;
   at least one scannable second memory element for receiving, at a data input, data having propagated from the data output of the first memory element through a path in a logic circuit operable in multiple cycles longer than one cycle of a system clock rate, operating with edges of the same clock signal as that used for the first memory element, and outputting data from a data output; and
   at least one scannable third memory element for receiving, at a data input, data having propagated from the data output of the first memory element through a single-cycle path in the logic circuit operable in one cycle of the system clock rate, operating with edges of the same clock signal as that used for the first memory element, and outputting data from a data output,
   the test method comprising a multi-cycle test step and a single-cycle test step,
   the multi-cycle test step comprising:
   a scan step of connecting the data input of each of the first, second and third memory elements with the data output of another of the scannable memory elements to define a plurality of scan chains and shifting a test pattern serially into all the scannable memory elements in the plurality of scan chains at a test clock rate;
   a multi-cycle hold step of holding data in the first memory element prior to a capture operation or during the scan step for the duration of the number of cycles equal to or greater than the number of multiple cycles required from the data output of the first memory element to the data input of the second memory element;
   a multi-cycle capture step of connecting the data inputs of the first, second and third memory elements with the logic circuit and capturing a response of the logic circuit to the test pattern via the data inputs of the memory elements; and
   a shift-out step of connecting the data input of each of the first, second and third memory elements with the data output of another of the scannable memory elements to define a the plurality of scan chains and shifting out data from the memory element, and
   the single-cycle test step comprising:
   the scan step;
   a single-cycle capture step of connecting the data inputs of the first, second and third memory elements with the logic circuit, and capturing a predetermined fixed value via the data input for the second memory element while capturing a response of the logic circuit to the test pattern via the data inputs for the memory elements other than the second memory element; and
   the shift-out step.

6. The test method for a semiconductor integrated circuit of claim 5, wherein a scan chain for the first memory element is defined separately from the other scan chains.

7. The test method for a semiconductor integrated circuit of claim 5, wherein the test pattern is shifted in during the shift-out step.

8. A test method for a semiconductor integrated circuit, comprising repeating the test method of claim 5 a necessary number of times.

9. A test method for a semiconductor integrated circuit having a multi-cycle path, the semiconductor integrated circuit comprising:
   a scannable first memory element operating with edges of a clock signal and having a data input and a data output;
   at least one scannable second memory element for receiving, at a data input, data having propagated from the data output of the first memory element through a path in a logic circuit operable in multiple cycles longer than one cycle of a system clock rate, operating with edges of the same clock signal as that used for the first memory element, and outputting data from a data output; and
   at least one scannable third memory element for receiving, at a data input, data having propagated from the data output of the first memory element through a single-cycle path in the logic circuit operable in one cycle of the system clock rate, operating with edges of the same clock signal as that used for the first memory element, and outputting data from a data output,
   the test method comprising a multi-cycle test step and a single-cycle test step,
   the multi-cycle test step comprising:
   a scan step of connecting the data input of each of the first, second and third memory elements with the data output of another of the scannable memory elements to define a plurality of scan chains and shifting a test pattern serially into all the scannable memory elements in the plurality of scan chains at a test clock rate;
   a multi-cycle hold step of holding data in the first memory element prior to a capture operation or during the scan step for the duration of the number of cycles equal to or greater than the number of multiple cycles required from the data output of the first memory element to the data input of the second memory element;
   a multi-cycle capture step of connecting the data inputs of the first, second and third memory elements with the logic circuit and capturing a response of the logic circuit to the test pattern via the data inputs of the memory elements; and
   a shift-out step of connecting the data input of each of the first, second and third memory elements with the data output of another of the scannable memory elements to define a the plurality of scan chains and shifting out data from the memory element, and
   the single-cycle test step comprising:
   the scan step;
   a single-cycle capture step of connecting the data input of the second memory element with the data output of another of the memory elements while connecting the data inputs of the memory elements other than the second memory element with the logic circuit, and capturing data output from the memory element immediately preceding the second memory element in the same scan chain of the second memory element while capturing a response of the logic circuit to the test pattern via the data inputs for the memory elements other than the second memory element; and
   the shift-out step.

10. The test method for a semiconductor integrated circuit of claim 9, wherein a scan chain for the first memory element is defined separately from the other scan chains.

11. The test method for a semiconductor integrated circuit of claim 9, wherein the test pattern is shifted in during the shift-out step.

12. A test method for a semiconductor integrated circuit, comprising repeating the test method of claim 9 a necessary number of times.

13. A semiconductor integrated circuit having a multi-cycle path, comprising:
   a scannable first memory element operating with edges of a clock signal and having a data input and a data output;
   at least one scannable second memory element for receiving, at a data input, data having propagated from the data output of the first memory element through a path in a logic circuit operable in multiple cycles longer than one cycle of a system clock rate, operating with edges of the same clock signal as that used for the first memory element, and outputting data from a data output;
   at least one scannable third memory element for receiving, at a data input, data having propagated from the data output of the first memory element through a single-cycle path in the logic circuit operable in one cycle of the system clock rate, operating with edges of the same clock signal as that used for the first memory element, and outputting data from a data output, and
   a multi-cycle test enable generation section for generating a signal for distinguishing a multi-cycle test mode from a single-cycle test mode,
   wherein the semiconductor integrated circuit has a multi-cycle test mode and a single-cycle test mode,
   in the multi-cycle test mode, a scan mode, a multi-cycle hold mode, a multi-cycle capture mode and a shift-out mode are selectively executed,
   in the single-cycle test mode, the scan mode, a single-cycle capture mode and the shift-out mode are selectively executed,
   in the scan mode, the data input of each of the first, second and third memory elements is connected with the data output of another of the memory elements to define a scan chain, and a test pattern is shifted serially into all the memory elements in the scan chain at a test clock rate,
   in the multi-cycle hold mode, data is held in the first memory element prior to a capture operation or during the scan step for the duration of the number of cycles equal to or greater than the number of multiple cycles required from the data output of the first memory element to the data input of the second memory element,
   in the multi-cycle capture mode, the data inputs of the first, second and third memory elements are connected with the logic circuit, and a response of the test pattern from the logic circuit is captured via the data inputs of the memory elements,
   in the shift-out mode, the data input of each of the first, second and third memory elements is connected with the data output of another of the scannable memory elements to define a scan chain, and data from the memory element is shifted out, to analyze the output response captured into the memory element, and
   in the single-cycle capture mode, the data inputs of the first, second and third memory elements are connected with the logic circuit, and data is held for the second memory element, while a response of the test pattern from the logic circuit is captured via the data inputs for the memory elements other than the second memory element.

14. The semiconductor integrated circuit of claim 13, further comprising:
   a clock enable signal generation section for generating a clock enable signal for holding the value of any of the scannable memory elements to configure the scannable memory element in one specific mode among the modes;
   a scan enable signal generation section for generating a scan enable signal for putting the scannable memory elements in the scan mode; and
   a multi-cycle test enable signal generation section for generating a multi-cycle test enable signal for selecting either the multi-cycle test mode or the single-cycle test mode.

15. The semiconductor integrated circuit of claim 13, wherein a pseudo-random pattern generator (PRPG) is used for generation of the test pattern.

16. The semiconductor integrated circuit of claim 13, wherein a compressor (MISR) is used for analysis of the output response.

* * * * *